United States Patent
Zhu et al.

(10) Patent No.: US 8,728,881 B2
(45) Date of Patent: May 20, 2014

(54) SEMICONDUCTOR DEVICE AND METHOD FOR MANUFACTURING THE SAME

(75) Inventors: Huilong Zhu, Poughkeepsie, NY (US); Haizhou Yin, Poughkeepsie, NY (US); Zhijiong Luo, Poughkeepsie, NY (US)

(73) Assignee: Institute of Microelectronics, Chinese Academy of Sciences, Beijing (CN)

(*) Notice: Subject to any disclaimer, the term of this patent is extended or adjusted under 35 U.S.C. 154(b) by 0 days.

(21) Appl. No.: 13/577,443

(22) PCT Filed: Nov. 25, 2011

(86) PCT No.: PCT/CN2011/082929
§ 371 (c)(1),
(2), (4) Date: Aug. 7, 2012

(87) PCT Pub. No.: WO2013/029314
PCT Pub. Date: Mar. 7, 2013

(65) Prior Publication Data
US 2013/0049069 A1    Feb. 28, 2013

(30) Foreign Application Priority Data
Aug. 31, 2011 (CN) .......................... 2011 1 0254187

(51) Int. Cl.
*H01L 21/336* (2006.01)

(52) U.S. Cl.
USPC ...... 438/157; 438/283; 257/328; 257/E21.41; 257/E29.201

(58) Field of Classification Search
USPC ............. 257/328, E21.41, E29.201; 438/157, 438/283
See application file for complete search history.

(56) References Cited

U.S. PATENT DOCUMENTS

| 7,323,375 | B2 | 1/2008 | Yoon et al. |
| 7,361,958 | B2* | 4/2008 | Brask et al. ................... 257/369 |
| 7,939,889 | B2* | 5/2011 | Yu et al. ......................... 257/347 |
| 2010/0248454 | A1* | 9/2010 | Maszara et al. ............... 438/478 |
| 2011/0147711 | A1* | 6/2011 | Pillarisetty et al. ............. 257/24 |

FOREIGN PATENT DOCUMENTS

| CN | 101228634 A | 7/2008 |
| CN | 101477986 A | 7/2009 |
| CN | 102214676 A | 10/2011 |

OTHER PUBLICATIONS

International Search Report from PCT/CN2011/082929 dated May 31, 2012 (5 pages).
Written Opinion from PCT/CN2011/082929 dated May 31, 2012 (6 pages).
Abstract CN101228634A dated Jul. 23, 2008 (2 pages).
Abstract CN101477986A dated Jul. 8, 2009 (3 pages).
Abstract CN102214676A dated Oct. 12, 2011 (2 pages).

* cited by examiner

Primary Examiner — Tuan N. Quach
(74) Attorney, Agent, or Firm — Osha Liang LLP

(57) ABSTRACT

Semiconductor devices and methods for manufacturing the semiconductor devices are disclosed. A semiconductor device includes a substrate, a fin formed above the substrate with a semiconductor layer formed between the substrate and the fin, and a gate stack crossing over the fin. The fin and the semiconductor layer may include different materials and have etching selectivity with respect to each other. A patterning of the fin can be stopped reliably on the semiconductor layer. Therefore, it is possible to better control the height of the fin and thus the channel width of the final device.

6 Claims, 8 Drawing Sheets

SEMICONDUCTOR DEVICE AND METHOD FOR MANUFACTURING THE SAME

CROSS REFERENCE TO RELEVANT APPLICATION(S)

This application is a national stage application based on PCT/CN2011/082929, filed on Nov. 25, 2011, which claims priority to Chinese Application No. 201110254187.4, entitled "SEMICONDUCTOR DEVICE AND METHOD FOR MANUFACTURING THE SAME", filed on Aug. 31, 2011. This application claims the benefit and priority of these prior applications by reference in their entireties.

TECHNICAL FIELD

The present disclosure relates to the field of semiconductor devices, and more particularly, to a semiconductor device and a method for manufacturing the same, by which it is possible to control a height of a fin in a more accurate way.

BACKGROUND

Fin Field Effect Transistors (FinFETs) are becoming increasingly attractive due to their good control of short channel effects. FIG. 1 is a perspective view schematically showing a FinFET by way of example. As shown in FIG. 1, the FinFET comprises a bulk Si substrate 100, a fin 101 formed on the bulk Si substrate 100, a gate stack 102 crossing the fin 101 and including, for example, a gate dielectric layer and a gate electrode layer (not shown), and an isolation layer (e.g., $SiO_2$) 103. In this FinFET, under the control of the gate electrode, conductive channels are formed in the fin 101, and specifically, in three side surfaces (i.e., a left side surface, a right side surface, and a top side surface as shown in the figure) of the fin 101. That is, a portion of the fin 101 under the gate electrode serves as a channel region, and source and drain regions are located at both sides of the channel region, respectively.

In the example shown in FIG. 1, the FinFET is formed on the bulk semiconductor substrate. Alternatively, a FinFET can be formed on other types of substrate such as a Semiconductor On Insulator (SOI) substrate. Furthermore, the FinFET shown in FIG. 1 has the channel formed in all the three side surfaces of the fin 101, and thus is referred to as a 3-gate FinFET. On the other hand, a 2-gate FinFET can be formed by, for example, providing an isolation layer (e.g., nitride) between the top surface of the fin 101 and the gate stack 102, in which case the top surface of the fin 101 will not be subject to the control of the gate electrode and thus will have no channel formed therein.

In the following, a conventional flow for manufacturing a FinFET is described with reference to FIGS. 2(a)-2(f).

As shown in FIG. 2(a), a bulk Si semiconductor layer 100 is provided, and an oxide (silicon oxide) layer 104 and a nitride (silicon nitride) layer 105 are formed sequentially thereon. For example, the oxide layer 104 may have a thickness of about 2-5 nm, and the nitride layer 105 may have a thickness of about 10-50 nm. The oxide layer 104 and the nitride layer 105 can sever as a hard mask layer in a later process. Further, a layer of patterned photo resist 106 is formed on the nitride layer 105. The patterned photo resist 106 is positioned where a fin is to be formed.

Next, as shown in FIG. 2(b), the hard mask layer (including the nitride layer 105 and the oxide layer 104) is patterned. Specifically, the nitride layer 105 is etched by means of, for example, Reactive Ion Etching (RIE), using the patterned photo resist 106 as a mask. The etching can be stopped on the oxide layer 104. Then, the oxide layer 104 is further etched by means of, for example, RIE, resulting in the patterned hard mask layer 104, 105. Finally, the photo resist 106 is removed.

Then, as shown in FIG. 2(c), the semiconductor layer 100 is patterned by means of, for example, RIE, using the patterned hard mask layer 104, 105 as a mask, to form a fin 101 on the semiconductor layer 100. Here, the height of the fin 100 may be controlled by setting process parameters during RIE, such as etching time and the like.

After the formation of the fin, as shown in FIGS. 2(d) and 2(e), an isolation layer is formed on both sides of the fin 101 over the semiconductor layer 100. Specifically, as shown in FIG. 2(d), firstly an oxide layer 103, such as a High Density Plasma (HDP) oxide layer (e.g., $SiO_2$), is deposited on the entire arrangement. The oxide layer 103 has its bottom portions thicker than its portions on side walls of the fin 101. Then, as shown in FIG. 2(e), the oxide layer 103 is etched isotropically to expose the side walls of the fin 101, resulting in the isolation layer 103.

Subsequently, as shown in FIG. 2(f), a gate dielectric layer 102-1 and a gate electrode layer 102-2 are formed to cross the fin 101, and thus constitutes a gate stack. After that, the process can proceed conventionally, to manufacture source/drain regions, metal interconnections to finish a final device.

In the above conventional process, the height of the fin 101 may be controlled by means of the etching process parameters during the patterning of the fin 101, and thus the channel width of the final device can be controlled. However, in this way the fin height is indirectly controlled by means of the process parameters, without direct control on the fin height. Therefore, such control is not sufficiently accurate.

Therefore, there is a need for a semiconductor device and a method for manufacturing the same, by which it is possible to control a height of a fin in a more accurate way.

SUMMARY

The present disclosure provides, among other things, a semiconductor device and a method for manufacturing the same.

According to an embodiment, there is provided a semiconductor device, comprising: a substrate; a fin formed above the substrate with a semiconductor layer formed therebetween; and a gate stack crossing over the fin, wherein the fin and the semiconductor layer comprise different materials, and have etching selectivity with respect to each other.

According to a further embodiment, there is provided a method for manufacturing a semiconductor device, the method comprising: providing a substrate; sequentially forming a first semiconductor layer and a second semiconductor layer on the substrate, wherein the first semiconductor layer and the second semiconductor layer comprise different materials and have etching selectivity with respect to each other; patterning the second semiconductor layer to form a fin; and forming a gate stack crossing over the fin.

According to some embodiments, two semiconductor layers, which comprise different materials and have etching selectivity with respect to each other, can be provided. Of those two layers, one can be patterned into a fin, and the other can serve as a stop layer in patterning the fin. As a result, the finally achieved fin can have a height corresponding to the height of the one of the semiconductor layers. Therefore, it is possible to well control the height of the fin and thus the channel width of the final device.

BRIEF DESCRIPTION OF THE DRAWINGS

The above and other objects, features, and advantages of the present disclosure will become apparent from following descriptions of embodiments with reference to the attached drawings, in which.

DETAILED DESCRIPTION

Figure 1:
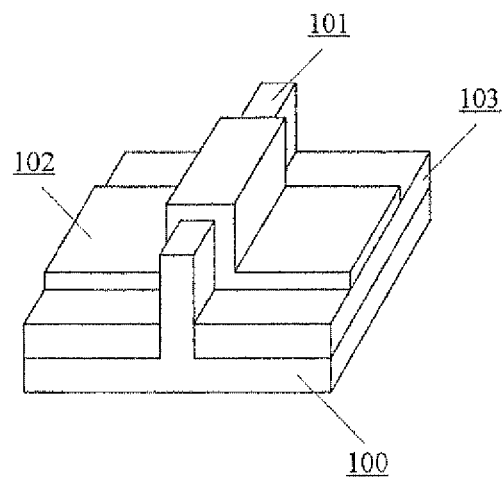
FIG. 1 is a perspective view schematically showing a conventional FinFET.

Hereinafter, descriptions are given with reference to embodiments shown in the attached drawings. However, it is to be understood that these descriptions are illustrative and not intended to limit the present disclosure. Further, in the following, known structures and technologies are not described to avoid obscuring the present disclosure unnecessarily.

In the drawings, various structural views and sectional views according to the embodiments are shown. However, they are not drawn to scale, and some features may be enlarged while some features may be omitted for sake of clarity. Moreover, shapes, sizes, and relative positions of regions and layers shown in the drawings are also illustrative, and deviations may occur due to manufacture tolerances and technique limitations in practice. Those skilled in the art can also devise regions/layers of other different shapes, sizes, and relative positions as desired.

Figure 3:
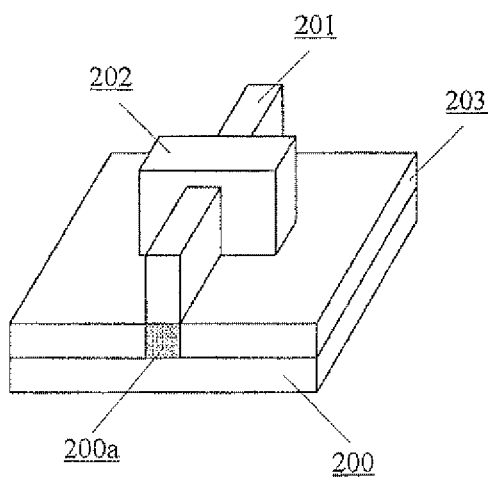
FIG. 3 is a perspective view schematically showing a semiconductor device according to an embodiment of the present disclosure.

FIG. 3 is a perspective view schematically showing a semiconductor device according to an embodiment of the present disclosure. As shown in FIG. 3, the semiconductor device may comprise: a substrate 200, a fin 201 formed on the substrate 200 with a semiconductor layer 200a interposed therebetween, and a gate stack 202 crossing the fin 201. The fin 201 and the semiconductor layer 200a can comprise different materials and thus have etching selectively with respect to each other.

For example, the substrate 200 may comprise a bulk semiconductor substrate, and may comprise any suitable semiconductor material such as Si, Ge, SiGe, III-V group compound semiconductor materials, and the like. Alternatively, the substrate 200 may be provided in any other suitable form such as a SOI substrate.

The fin 201 may be achieved by patterning a semiconductor material layer. Specifically, in patterning the fin, etching can be stopped on the semiconductor layer 200a because of the etching selectivity between the material for the fin 201 and the material for the semiconductor layer 200a. For example, in a case where the semiconductor material layer constituting the fin 201 comprises Si, the semiconductor layer 200a may comprise SiGe.

The gate stack 202 may comprise a gate dielectric layer such as $SiO_2$ and a gate electrode layer such as poly silicon (not shown). Preferably, the gate dielectric layer can comprise high-K dielectric such as $HfO_2$, HfSiO, HfSiON, HfTaO, HfTiO, HfZrO, $Al_2O_3$, $La_2O_3$, $ZrO_2$, LaAlO, and the like, and the gate electrode layer can comprise a metal gate electrode such as Ti, Co, Ni, Al, W, and the like. More preferably, there may be a work function adjustment layer interposed between the gate dielectric layer and the gate electrode layer. For example, the work function adjustment layer may comprise TiN, TiAlN, TaN, TaAlN, TaC, and the like.

In this semiconductor device, the semiconductor layer 200a may have a width substantially same as that of the fin 201. Here, the term "same" means that one is equal to the other, with a tolerance acceptable in the semiconductor industry. On both sides of the semiconductor layer 200a over the substrate 200, an isolation layer 203 comprising dielectric such as $SiO_2$ may be formed, to separate the gate stack 202 from the substrate 200. It is to be noted that the top surfaces of the isolation layer 203 and the semiconductor layer 200a are shown in the FIG. 3 to be aligned with each other for convenience of illustration, although the top surface of the isolation layer 203 can be preferably set to protrude slightly with respect to the top surface of the semiconductor layer 200a.

In this semiconductor device, because the patterning of the fin can be stopped reliably on the semiconductor layer 200a, the height of the fin 201 (and thus the channel width for a final device) can be dominantly determined by the height of the semiconductor material layer constituting the fin 201. Therefore, it is possible to directly control the height of the fin and thus to directly control the channel width by controlling the height of the semiconductor material layer constituting the fin.

Further, in this semiconductor device, the fin 201 connects to the substrate 200 via the semiconductor layer 200a, and thus the heat dissipation property can be guaranteed.

Next, an example method for manufacturing the semiconductor device shown in FIG. 3 will be described with reference to FIG. 4. The following descriptions are given with respect to Si based materials, by way of example. However, it is to be understood that the present disclosure is not limited to the Si based materials, but is also applicable to other semiconductor materials.

Figure 4A:
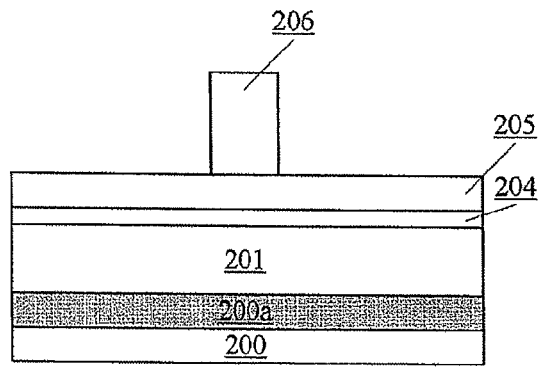
FIGS. 4(a)-4(j) are sectional views schematically showing structures obtained in different steps in a flow of manufacturing a semiconductor device according to an embodiment of the present disclosure.

As shown in FIG. 4(a), a bulk Si substrate 200 is provided, and a first semiconductor layer 200a and a second semiconductor layer 201 are formed sequentially thereon. Here, the first semiconductor layer 200a and the second semiconductor layer 201 may comprise different materials from each other and thus have etching selectivity with respect to each other. For example, the first semiconductor layer 200a may comprise a layer of SiGe (where the atomic percentage of Ge may be about 5-10%) with a thickness of about 10-50 nm, and the second semiconductor layer 201 may comprise a layer of Si with a thickness of about 20-150 nm. The first semiconductor layer 200a and the second semiconductor layer 201 may be formed on the substrate 200 sequentially by means of, for example, epitaxy. Here, the second semiconductor layer 201 can serve as a main body layer for a fin to be formed, and the first semiconductor layer 200a can serve as an etching stop layer in patterning the second semiconductor layer 201 to form the fin.

Further, on the second semiconductor layer 201, an oxide layer (e.g. silicon oxide) 204 and a nitride layer (e.g., silicon nitride) 205 may be formed sequentially. For example, the oxide layer 204 may have a thickness of about 2-5 nm, and the nitride layer 205 may have a thickness of about 10-50 nm. The oxide layer 204 and the nitride layer 205 can serve as a hard mask in a later process. Further, a patterned photo resist layer 206 can be formed on the nitride layer 205 so that it is positioned where the fin is to be formed.

Figure 4B:
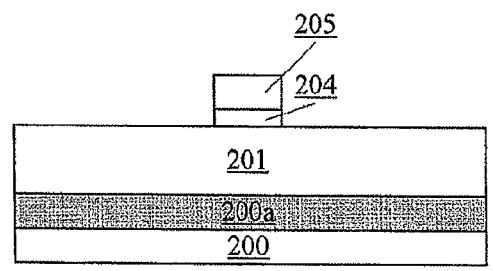

Then, as shown in FIG. 4(b), the hard mask layer (including the nitride layer 205 and the oxide layer 204) can be patterned. Specifically, the nitride layer 205 may be etched by means of, for example, Reactive Ion Etching (RIE), by using the patterned photo resist layer 206 as a mask. The etching can be stopped on the oxide layer 204. After that, the oxide layer 204 is further etched by means of, for example, RIE. The etching can be stopped on the second semiconductor layer 201. This results in the patterned hard mask layer 204, 205. Finally, the photo resist layer 206 can be removed.

Figure 4C:
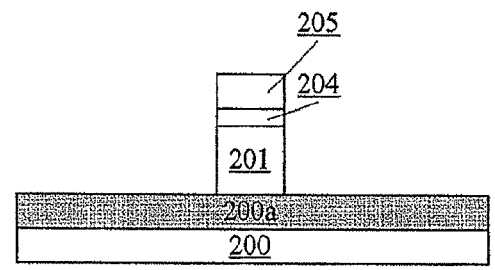

Next, as shown in FIG. 4(c), the second semiconductor layer 201 can be patterned by means of, for example, RIE by using the patterned hard mask layer 204, 205 as a mask. Specifically, the second semiconductor layer 201 comprising Si is selectively etched with respect to the first semiconductor layer 200a comprising SiGe, resulting in the fin 201 made from the second semiconductor layer. Here, due to the etching selectivity between the first semiconductor layer 200a and the second semiconductor layer 201, the patterning of the fin can be stopped reliably on the first semiconductor layer 200a. Thus, the finally achieved fin 201 can have a height which is determined by the height of the second semiconductor layer provided previously. The height of the second semiconductor layer, which is formed by means of, for example, epitaxy, can be well controlled. Therefore, it is possible to well control the height of the fin 201, and thus to well control the channel width of a final device.

After the formation of the fin, other parts of the device may be manufactured in a conventional way. Here, to further control the channel width of the final device, a gate stack can be preferably manufactured as follows.

Figure 4D:
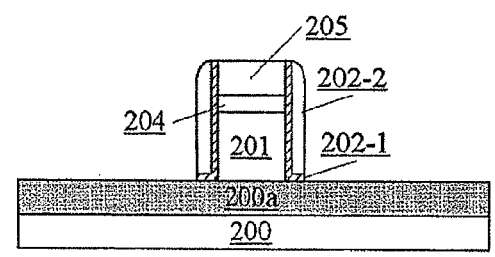

Specifically, as shown in FIG. 4(d), a gate dielectric layer 202-1 may be formed on side surfaces of the fin 201. Preferably, a work function adjustment layer 202-2 may be formed on outer sides of the gate dielectric layer. Preferably, the gate dielectric layer can comprise high-K dielectric such as $HfO_2$, HfSiO, HfSiON, HfTaO, HMO, HfZrO, $Al_2O_3$, $La_2O_3$, $ZrO_2$, LaAlO, and the like, and the work function adjustment layer may comprise TiN, TiAlN, TaN, TaAlN, TaC, and the like. More specifically, firstly a high-K dielectric layer with a thickness of about 2-5 nm may be formed on the entire arrangement shown in FIG. 4(c) by means of, for example, deposition, and then a work function adjustment layer with a thickness of about 3-15 nm may be deposited. Next, the work function adjustment layer may be patterned by means of, for example, RIE, so that the work function adjustment layer takes a form of spacers as shown in FIG. 4(d). Subsequently, the high-K dielectric layer may be subjected to RIE, to remove exposed portions thereof, resulting in the gate dielectric layer 202-1 as shown in FIG. 4(d). FIG. 4(d) shows an example where both the gate dielectric layer 202-1 and the work function adjustment layer 202-2 are formed. However, the present disclosure is not limited thereto. It is also feasible to form only the gate dielectric layer 202-1 in form of spacers.

In this embodiment, it is shown that the gate dielectric layer 202-1 and the optional work function adjustment layer 202-2 are formed on two side walls of the fin, with the hard mask layer 204, 205 remained on the top surface of the fin (which arrangement will result in a 2-gate device). However, the present disclosure is not limited thereto, and is also applicable to a 3-gate device. For example, the hard mask layer 204, 205 can be removed from the top surface of the fin, and the gate dielectric layer and the optional work function adjustment layer can formed on three side surfaces (i.e., the left and right side surfaces and the top surface) of the fin.

Figure 2A:
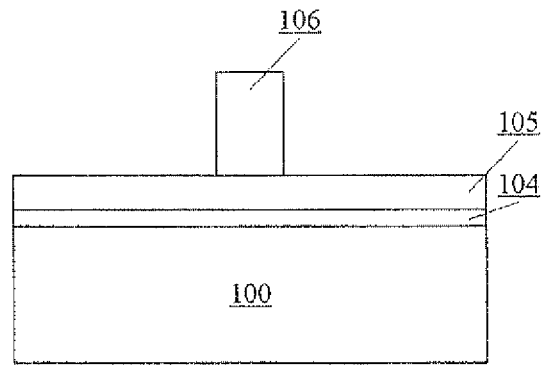
FIGS. 2(a)-2(f) are sectional views schematically showing structures obtained in different steps in a conventional flow of manufacturing a semiconductor device.
Figure 2B:
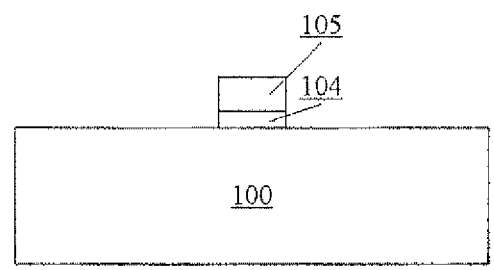
Figure 2C:
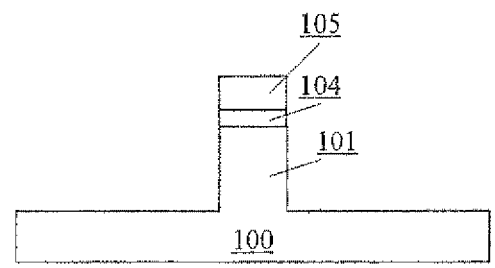
Figure 2D:
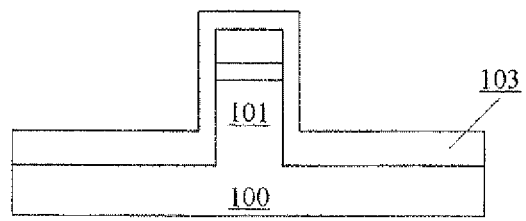
Figure 2E:
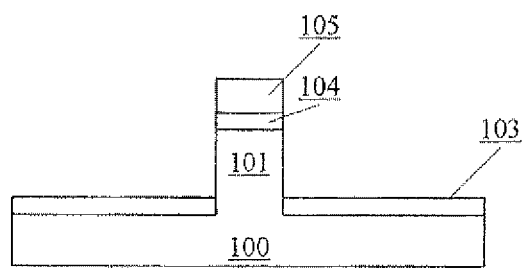
Figure 2F:
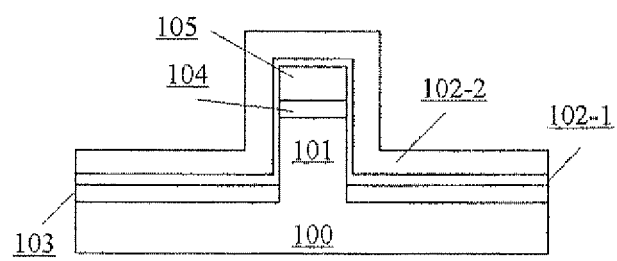

According to this embodiment, the gate dielectric layer 202-1 and the work function adjustment layer 202-2 are formed on the side surfaces of the fin 201 immediately after the formation of the fin 201, unlike the conventional process where an isolation layer is formed on both sides of a fin and then a gate dielectric layer and a work function adjustment layer are formed on both sides of the fin over the isolation layer (referring to FIGS. 2(e) and 2(f)). According to the conventional process, the height of a portion of the fin which is covered by the gate dielectric layer (and thus, the channel width for a final device) is determined not only by the height of the fin, but also by the height of the isolation layer (referring to FIG. 1). In contrast, according to the embodiment of the present disclosure, the gate dielectric layer covers the fin in its entire height, regardless of the height of an isolation layer to be formed later. More specifically, regardless of whether an isolation layer 203 is etched relatively higher or lower in a later process of etching the isolation layer (referring to FIG. 4(h)), a gate electrode 202-3 can connect to the fin in its entire height via the work function adjustment layer and the gate dielectric layer (referring to FIG. 4(j)), and thus the channel width can be well controlled.

Here, the gate dielectric layer and the optional work function adjustment layer are formed to cover at least the entire height of the fin, so that the gate electrode formed later can control the fin in its entire height through them. However, the forms the gate dielectric layer and the work function adjustment layer take and the way to manufacture them are not limited to the above embodiment. Alternatively, firstly a gate dielectric material layer may be deposited and then etched to form a gate dielectric layer in form of spacers, and subsequently a work function adjustment material layer may be deposited and etched to form a work function adjustment layer in form of spacers. Further, the gate dielectric layer and the work function adjustment layer are not limited to the exact form of spacers, but can slightly deviate from the form of spacers, provided that they can cover the entire height of the fin. For example, they may have a bottom portion extending to some extent over the surface of the first semiconductor layer 200a.

Figure 4E:
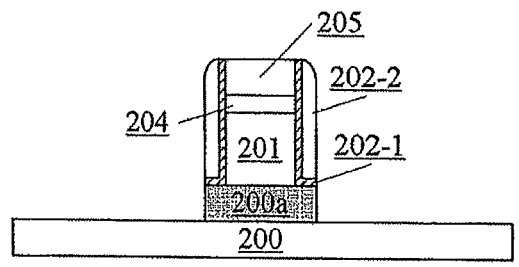
Figure 4F:
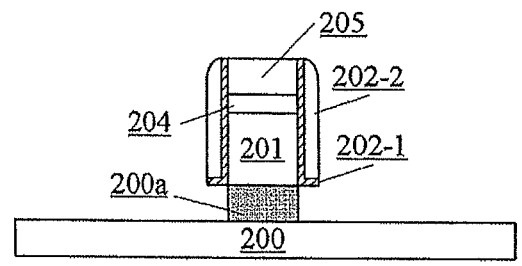

Next, as shown in FIGS. 4(e) and 4(f), the first semiconductor layer 200a may be patterned to leave a portion thereof under the fin 201 remained. Specifically, as shown in FIG. 4(e), firstly the first semiconductor layer 200a comprising SiGe may be subjected to RIE, by using the fin 201 and the work function adjustment layer 202-2 as a mask. The RIE can be stopped on the substrate 200 comprising Si. Next, as shown in FIG. 4(f), the first semiconductor layer 200a comprising SiGe may be selectively etched with respect to Si (in a horizontal direction as shown in the figure, that is, in a lateral direction), so that the first semiconductor layer 200a remains under the fin 201. As a result, the first semiconductor layer 200a has a width substantially same as that of the fin 201. In this way, it is possible to ensure a good body contact between the fin 201 and the substrate 200 (which cannot be achieved if the width of the first semiconductor layer 200a is relatively smaller), and on the other hand to ensure a good electric isolation of the gate electrode to be formed later from the fin 201 (by means of the isolation layer formed on both sides of the first semiconductor layer 200a) (here, if the width of the first semiconductor layer 200a is relatively larger, the gate electrode may come to be in contact with the first semiconductor layer 200a and thus electrically connect to the fin 201).

Figure 4G:
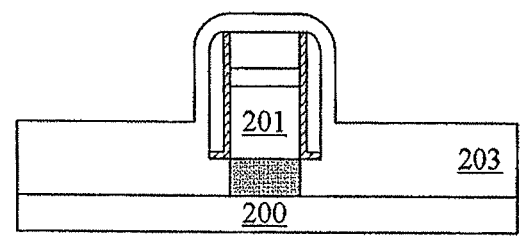
Figure 4H:
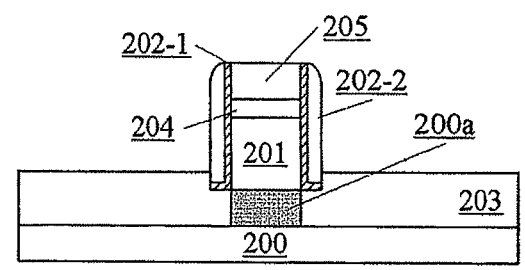

Subsequently, as shown in FIGS. 4(g) and 4(h), an isolation layer may be formed on both sides of the first semiconductor layer 200a over the substrate 200. Specifically, as shown in FIG. 4(g), firstly on the whole structure an oxide layer 203, such as a High Density Plasma (HDP) oxide (e.g., $SiO_2$) layer, may be deposited. The oxide layer 203 may have its bottom portion thicker and have portions on side walls of the fin 201 thinner. Then, as shown in FIG. 4(h), the oxide layer 2003 is isotropically etched back to expose the side walls of the fin 201, resulting in the isolation layer 203. Preferably, the top surface of the isolation layer 203 can protrude slightly with respect to the top surface of the first semiconductor layer 200a.

Figure 4I:
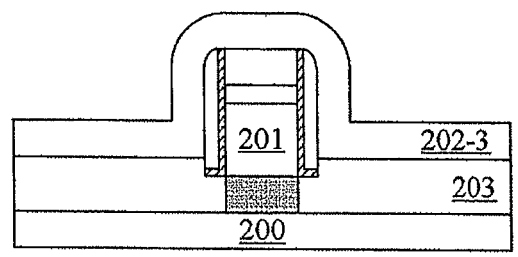
Figure 4J:
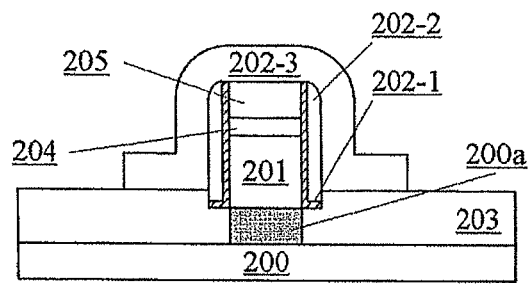

Then, as shown in FIG. 4(i), a gate electrode layer 202-3 may be formed to cross the fin 201. The gate electrode layer 202-3 may comprise poly silicon, and alternatively may comprise a metal gate electrode such as Ti, Co, Ni, Al, W, and the like. Next, as shown in FIG. 4(j), the gate stack may be patterned. Specifically, firstly the gate electrode layer 202-3 may be patterned by means of, for example, RIE, to keep a portion thereof corresponding to the gate electrode to be finally formed, and then the work function adjustment layer 202-2 may be patterned by means of, for example, RIE, to remove portions thereof exposed by the gate electrode layer 202-3. Optionally, the gate dielectric layer 202-1 may be also patterned by means of, for example, RIE, to remove portions thereof exposed by the gate electrode layer 202-3. Here, it is to be noted that the gate dielectric layer can be left as it is, without being patterned. In this case, the gate dielectric layer can spread over the entire length of the fin, which will not impact the performances of the final device.

After that, the process can proceed as in the conventional process for formation of source and drain regions, metal interconnection, and the like, to obtain the final device.

Thus, the semiconductor device according to this embodiment is achieved. This semiconductor device is similar in perspective view to that shown in FIG. 3 (where the specific configuration of the gate stack and also the hard mask layer are not shown).

Referring to the sectional view of FIG. 4(j) and also the perspective view of FIG. 3, according to this embodiment the height of the fin 201 is determined by the height of the second semiconductor layer 201. Therefore, it is possible to well control the height of the fin and thus the channel width of the final device.

Figure 5:
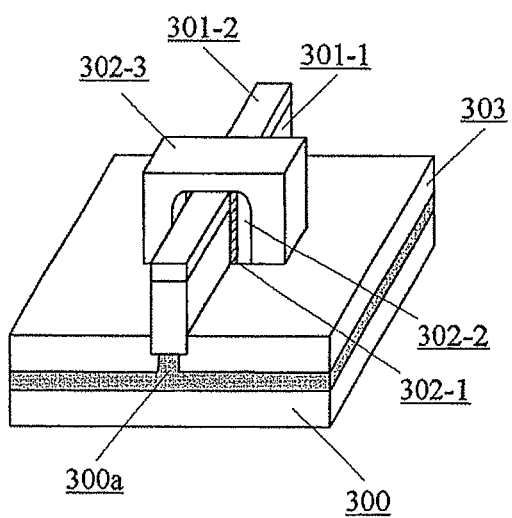
FIG. 5 is a perspective view schematically showing a semiconductor device according to a further embodiment of the present disclosure.

FIG. 5 is a sectional view schematically showing a semiconductor device according to a further embodiment of the present disclosure. The semiconductor device according to this embodiment is substantially same as those shown in FIGS. 3 and 4, but with an isolation layer formed in a different way.

Specifically, as shown in FIG. 5, the semiconductor device may comprise: a substrate 300, a fin 301-1 formed on the substrate 300 with a semiconductor layer 300a interposed therebetween, and a gate stack crossing the fin 301 (and including a gate dielectric layer 302-1, a work function adjustment layer 302-2, and a gate electrode layer 302-3). The fin 301-1 and the semiconductor layer 300a can comprise different materials and thus have etching selectively with respect to each other. In the perspective view of FIG. 5, a hard mask layer 301-2 is also shown on top of the fin 301-1. It is to be understood by those skilled in the art that the hard mask layer can be eliminated.

As for materials of the substrate and the respective layers, reference may be made to the above embodiments, and detailed descriptions thereof are omitted here.

In this embodiment, the isolation layer 303 may comprise an insulator (such as oxide) achieved by processing (for example, oxidizing) the first semiconductor layer 300a.

Hereinafter, an example method for manufacturing the semiconductor device shown in FIG. 5 will be described with reference to FIG. 6. The following descriptions are given with respect to Si based materials, by way of example. However, it is to be understood that the present disclosure is not limited to the Si based materials, but is also applicable to other semiconductor materials.

Figure 6A:
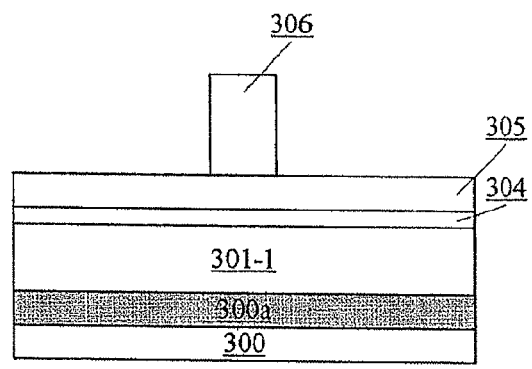
FIGS. 6(a)-6(g) are sectional views schematically showing structures obtained in different steps in a flow of manufacturing a semiconductor device according to a further embodiment of the present disclosure.

As shown in FIG. 6(a), a bulk Si substrate 300 is provided, and a first semiconductor layer 300a and a second semiconductor layer 301-1 are formed sequentially thereon. Here, the first semiconductor layer 300a and the second semiconductor layer 301-1 may comprise different materials from each other and thus have etching selectivity with respect to each other. For example, the first semiconductor layer 300a may comprise a layer of SiGe (where the atomic percentage of Ge may be about 5-10%) with a thickness of about 10-50 nm, and the second semiconductor layer 301-1 may comprise a layer of Si with a thickness of about 20-150 nm. The first semiconductor layer 300a and the second semiconductor layer 301-1 may be formed on the substrate 300 sequentially by means of, for example, epitaxy.

Further, on the second semiconductor layer 301-1, an oxide layer (e.g. silicon oxide) 304 and a nitride layer (e.g., silicon nitride) 305 may be formed sequentially. For example, the oxide layer 304 may have a thickness of about 2-5 nm, and the nitride layer 305 may have a thickness of about 10-50 nm. The oxide layer 304 and the nitride layer 305 can serve as a hard mask in a later process. Further, a patterned photo resist layer 306 can be formed on the nitride layer 305 so that it is positioned where the fin is to be formed.

Figure 6B:
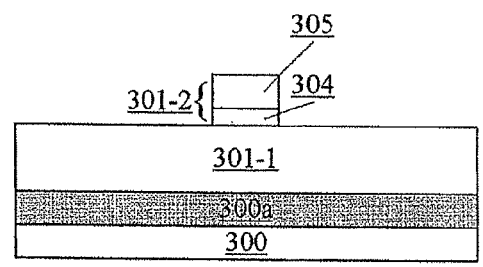

Then, as shown in FIG. 6(b), the hard mask layer (including the nitride layer 305 and the oxide layer 304) can be patterned. Specifically, the nitride layer 305 may be etched by means of, for example, RIE, by using the patterned photo resist layer 306 as a mask. The etching can be stopped on the oxide layer 304. After that, the oxide layer 304 is further etched by means of, for example, RIE. The etching can be stopped on the second semiconductor layer 301-1. This results in the patterned hard mask layer 301-2. Finally, the photo resist layer 306 can be removed.

Figure 6C:
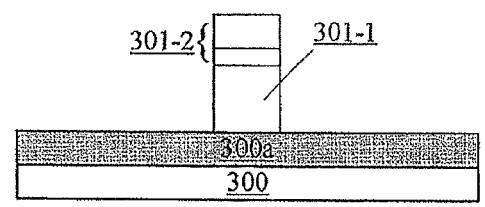

Next, as shown in FIG. 6(c), the second semiconductor layer 301-1 can be patterned by means of, for example, RIE by using the patterned hard mask layer 301-2 as a mask. Specifically, the second semiconductor layer 301-1 comprising Si is selectively etched with respect to the first semiconductor layer 300a comprising SiGe, resulting in the fin 301-1 made from the second semiconductor layer. Here, due to the etching selectivity between the first semiconductor layer 300a and the second semiconductor layer 301-1, the patterning of the fin can be stopped reliably on the first semiconductor layer 300a. Thus, the finally achieved fin 301-1 can have a height which is determined by the height of the second semiconductor layer provided previously. The height of the second semiconductor layer, which is formed by means of, for example, epitaxy, can be well controlled. Therefore, it is possible to well control the height of the fin 301-1, and thus to well control the channel width of a final device.

Figure 6D:
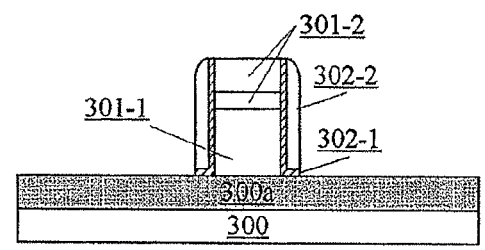

After the formation of the fin, as shown in FIG. 6(d), a gate dielectric layer 302-1 may be formed on side surfaces of the fin 301-1, and preferably a work function adjustment layer 302-2 may be further formed. For materials and formation of the gate dielectric layer 302-1 and the work function adjustment layer 302-2, reference may be made to the above descriptions in conjunction with FIG. 4(d).

According to this embodiment, the gate dielectric layer 302-1 and the work function adjustment layer 302-2 are formed on the side surfaces of the fin 301-1 immediately after the formation of the fin 301-1, unlike the conventional process where an isolation layer is formed on both sides of a fin and then a gate dielectric layer and a work function adjustment layer are formed on both sides of the fin over the isolation layer (referring to FIGS. 2(e) and 2(f)). According to the conventional process, the height of a portion of the fin which is covered by the gate dielectric layer is determined not only by the height of the fin, but also by the height of the isolation layer. In contrast, according to the embodiment of the present disclosure, the gate dielectric layer covers the fin in its entire height, regardless of the height of an isolation layer to be formed later.

Figure 6E:
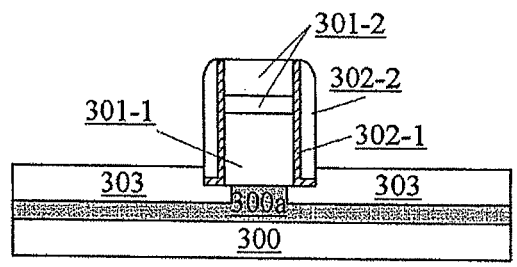

Next, as shown in FIG. 6(e), the first semiconductor layer 300a may be subjected to oxidation, so that portions of the first semiconductor layer 300a close to its exposed surface are converted in to oxide, which in turn constitutes the isolation layer 303. The oxidation may be conducted by heat treatment in an oxygen atmosphere, for example. A portion of the first semiconductor layer 300a under the fin 301-1 will be protected from oxidation because it is covered by the fin 301-1 and the hard mask layer 301-2, and thus reliably connects the fin 301-1 to the substrate 300.

Certainly, the present disclosure is not limited thereto. It is apparent for those skilled in the art to process the first semiconductor layer 300a in a different way (for example, by nitriding it) so that the portions of the first semiconductor layer 300a close to its exposed surface are converted into an insulator to form the isolation layer.

Figure 6F:
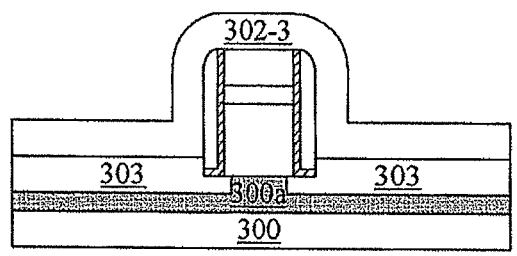
Figure 6G:
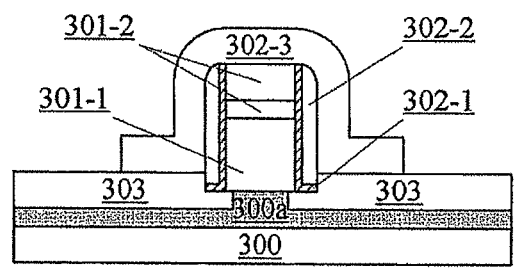

Then, as shown in FIG. 6(f), a gate electrode layer 302-3 may be formed to cross the fin 301-1, and as shown in FIG. 6(g), the gate stack may be patterned. As for processes for forming the gate stack, reference may be made to above descriptions in conjunction with FIGS. 4(i) and 4(j).

According to this embodiment, it is possible to form the isolation layer conveniently and thus to further simplify the process. Further, the embodiment can also achieve the same advantages as the above embodiments.

In the above descriptions, details of patterning and etching of the layers are not described. It is understood by those skilled in the art that various measures may be utilized to form the layers and regions in desired shapes. Further, to achieve the same feature, those skilled in the art can devise processes not entirely the same as those described above. The mere fact that various features are described in the respective embodiments does not mean that some of those features cannot be used in combination to advantage.

From the foregoing, it will be appreciated that specific embodiments of the disclosure have been described herein for purposes of illustration, but that various modifications may be made without deviating from the disclosure. Accordingly, the technology is not limited except as by the appended claims.

We claim:

1. A method for manufacturing a semiconductor device, comprising:
    sequentially forming a first semiconductor layer and a second semiconductor layer on a substrate, wherein the first semiconductor layer and the second semiconductor layer comprise different materials and have etching selectivity with respect to each other;
    patterning the second semiconductor layer to form a fin;
    forming a gate dielectric layer on side surfaces of the fin over a top surface of the first semiconductor layer;
    patterning the first semiconductor layer to keep a portion thereof under the fin;
    forming an isolation layer on opposite sides of the kept portion of the first semiconductor layer over the substrate;
    forming a gate electrode layer crossing over the fin on the isolation layer; and
    patterning the gate dielectric layer and the gate electrode layer to form a gate stack.

2. The method according to claim 1, further comprising forming a work function adjustment layer on side surfaces of the gate dielectric layer as a spacer to the gate dielectric layer prior to the formation of the isolation layer.

3. The method according to claim 2, wherein patterning the first semiconductor layer to keep a portion thereof under the fin comprises:
    etching the first semiconductor layer with the fin and the work function adjustment layer as a mask; and
    further laterally etching the first semiconductor layer so that the first semiconductor layer has a width substantially the same as that of the fin.

4. A method for manufacturing a semiconductor device, comprising:
    sequentially forming a first semiconductor layer and a second semiconductor layer on a substrate, wherein the first semiconductor layer and the second semiconductor layer comprise different materials and have etching selectivity with respect to each other;
    patterning the second semiconductor layer to form a fin;
    forming a gate dielectric layer on side surfaces of the fin over a top surface of the first semiconductor layer;
    processing the first semiconductor layer to convert portions of the first semiconductor layer exposed by the fin and the gate dielectric layer into an insulator so that an isolation layer is formed thereby;
    forming a gate electrode layer crossing over the fin on the isolation layer; and
    patterning the gate electrode layer and the gate dielectric layer to form a gate stack.

5. The method according to claim 4, wherein processing the first semiconductor layer comprises processing the first semiconductor layer by oxidation.

6. The method according to claim 4, further comprising forming a work function adjustment layer on side surfaces of the gate dielectric layer prior to the formation of the isolation layer.

* * * * *